(12) United States Patent
Cho et al.

(10) Patent No.: US 11,349,038 B2
(45) Date of Patent: May 31, 2022

(54) QUANTUM DOT COMPLEX AND DISPLAY APPARATUS INCLUDING THE SAME

(71) Applicant: SAMSUNG ELECTRONICS CO., LTD., Suwon-si (KR)

(72) Inventors: Jinhyun Cho, Suwon-si (KR); Pilyong Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 17/126,221

(22) Filed: Dec. 18, 2020

(65) Prior Publication Data
US 2021/0202765 A1    Jul. 1, 2021

(30) Foreign Application Priority Data
Dec. 26, 2019  (KR) .................. 10-2019-0175665

(51) Int. Cl.
| H01L 31/0352 | (2006.01) |
| C09K 11/02 | (2006.01) |
| C09K 11/70 | (2006.01) |
| G02F 1/017 | (2006.01) |
| G02F 1/13357 | (2006.01) |
| B82Y 40/00 | (2011.01) |
| B82Y 20/00 | (2011.01) |
| B82Y 30/00 | (2011.01) |

(52) U.S. Cl.
CPC ...... *H01L 31/035218* (2013.01); *C09K 11/02* (2013.01); *C09K 11/70* (2013.01); *G02F 1/01791* (2021.01); *G02F 1/133603* (2013.01); *B82Y 20/00* (2013.01); *B82Y 30/00* (2013.01); *B82Y 40/00* (2013.01)

(58) Field of Classification Search
CPC ................................................ G02F 1/133603
See application file for complete search history.

(56) References Cited

U.S. PATENT DOCUMENTS

| 6,794,265 B2 * | 9/2004 | Lee ................. H01L 29/127 |
| | | 252/301.6 F |
| 2009/0001349 A1 | 1/2009 | Kahen |
| 2018/0158983 A1 | 6/2018 | Jang et al. |

FOREIGN PATENT DOCUMENTS

| CN | 107359264 A | 11/2017 |
| CN | 108242482 A | 7/2018 |
| KR | 10-0276431 B1 | 12/2000 |
| KR | 10-2017-0035688 A | 3/2017 |
| KR | 10-1730164 B1 | 4/2017 |
| KR | 10-2018-0064033 A | 6/2018 |

OTHER PUBLICATIONS

International Search Report dated Apr. 21, 2021 issued by the International Searching Authority in International Application No. PCT/KR2020/019145 (PCT/ISA/210).

* cited by examiner

*Primary Examiner* — Vip Patel
(74) *Attorney, Agent, or Firm* — Sughrue Mion, PLLC

(57) ABSTRACT

The display apparatus includes a light source; and a quantum dot complex disposed in front of the light source, and configured to convert a wavelength of light emitted from the light source. The quantum dot complex includes an oxide having dendritic structure; and a quantum dot bonded to the oxide.

15 Claims, 22 Drawing Sheets

FIG. 8

| MATERIAL | THERMAL CONDUCTIVITY |
|---|---|
| QD (InP) | 68 |
| Silica | 1.8 |
| $Al_2O_3$ | 30 |
| $TiO_2$ | 10 |

(3-Mercaptopropyl)trimethoxysilane (MPTMS)

MIXED QUANTUM DOT COMPLEX

RED QUANTUM DOT COMPLEX

GREEN QUANTUM DOT COMPLEX

BLUE QUANTUM DOT COMPLEX

FIG. 19

| EFFICIENCY | | R | G | B |
|---|---|---|---|---|
| RGB micro LED | | 5% | 20% | 40% |
| QD+blue micro LED | B EFFICIENCY | 40% | 40% | 40% |
| | QD CONVERSION EFFICIENCY | 69% | 85% | - |
| | TOTAL EFFICIENCY | 27%(~5X) | 34%(~1.7X) | 40%(~1X) | ered as it is to generate white light with high color purity, thereby

QUANTUM DOT COMPLEX AND DISPLAY APPARATUS INCLUDING THE SAME

CROSS-REFERENCE TO RELATED APPLICATION(S)

This application is based on and claims priority under 35 U.S.C. § 119 to Korean Patent Application No. 10-2019-0175665, filed on Dec. 26, 2019, the disclosure of which is incorporated by reference herein in its entirety.

BACKGROUND

1. Field

The disclosure relates to a quantum dot complex and a display apparatus including the same.

2. Description of Related Art

A quantum dot is a semiconductor crystal having a diameter of several tens of nanometers or less, and when light such as ultraviolet rays or visible rays is incident on the quantum dot, light of various colors may be generated by a quantum confinement effect.

Recently, such quantum dots have been applied to display apparatuses and utilized in various ways. For example, by applying the quantum dot to a backlight unit of the display apparatus, blue light emitted from a blue light emitting diode (LED) used as a backlight light source is converted into green light and red light, and some blue light is transmitted as it is to generate white light with high color purity, thereby realizing high luminance and excellent color reproducibility.

Alternatively, the quantum dot may be applied to a color filter used to implement an RGB subpixel of the display apparatus to convert light emitted from a light source into red light, green light, and blue light, or into red light and green light.

SUMMARY

Embodiments provide a quantum dot complex that can prevent the reliability of a quantum dot from deteriorating due to concentrated heating of the quantum dot by light emitted from a light source by combining oxide that acts as a heat sink to the quantum dot, and a display apparatus including the same.

Additional aspects will be set forth in part in the description which follows and, in part, will be apparent from the description, or may be learned by practice of the presented embodiments.

According to an aspect of the disclosure, there is provided a display apparatus including: a light source; and a quantum dot complex disposed in front of the light source, and configured to convert a wavelength of light emitted from the light source. The quantum dot complex may include an oxide having dendritic structure; and a quantum dot bonded to the oxide.

The oxide may include at least one selected from a group including silicon dioxide ($SiO_2$), aluminum oxide ($Al_2O_3$), and titanium dioxide ($TiO_2$).

The oxide may be configured to have a functional group chemically bonded to a surface of the quantum dot on the surface.

The oxide may include $SiO_2$, and is surface-treated by a silane coupling agent to have a thiol functional group.

The quantum dot may be configured to physically adsorb to the surface of the surface-treated silicon dioxide and chemically bond with the thiol functional group.

The quantum dot complex may be disposed in front of the light source in an in-chip method or an on-chip method.

The display apparatus may further include a liquid crystal panel; and a backlight unit configured to supply light to the liquid crystal panel. The backlight unit may include the light source and the quantum dot complex.

The light source may include a blue light emitting diode (LED) configured to emit blue light. The quantum dot complex may include a red quantum dot configured to convert the blue light into red light; and a green quantum dot configured to convert the blue light into green light.

The light source may include a blue LED included in a red subpixel, a blue LED included in a green subpixel, and a blue LED included in a blue subpixel. The quantum dot complex may include a red quantum dot complex that is included in the red subpixel, and configured to convert the blue light to red light; and a green quantum dot complex that is included in the green subpixel, and configured to convert the blue light to green light.

The oxide may be configured to emit heat generated by the light source or the quantum dot.

According to an aspect of the disclosure, there is provided a quantum dot complex including: an oxide having dendritic structure; and a quantum dot bonded to the oxide.

The oxide may include at least one selected from a group including $SiO_2$, $Al_2O_3$, and $TiO_2$.

The oxide may be configured to have a functional group chemically bonded to a surface of the quantum dot on the surface.

The oxide may include $SiO_2$, and is surface-treated by a silane coupling agent to have a thiol functional group.

The quantum dot may be configured to physically adsorb to the surface of the surface-treated silicon dioxide and chemically bond with the thiol functional group.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 8 is a table illustrating an example of types of oxides bonded with a quantum dot complex according to an embodiment.

FIG. 19 is a table illustrating efficiency of color conversion of blue light using quantum dots in a micro LED display apparatus according to an embodiment.

DETAILED DESCRIPTION

Figure 1:
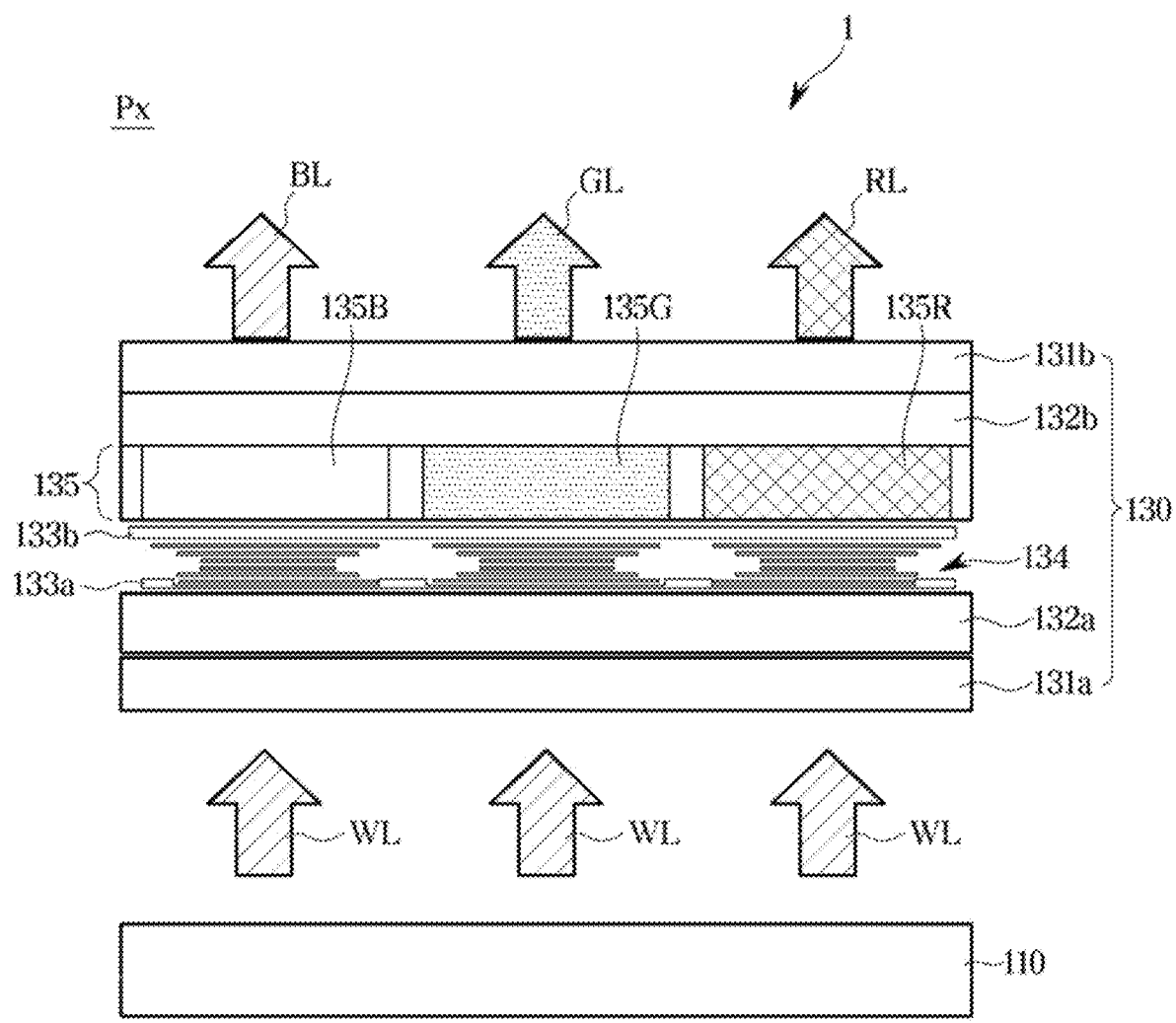
FIG. 1 is a side cross-sectional view illustrating a structure of a single pixel when a display apparatus is a liquid crystal display (LCD) according to an embodiment.

Like reference numerals refer to like elements throughout the disclosure. Not all elements of embodiments of the disclosure will be described, and description of what are commonly known in the art or what overlap each other in the embodiments will be omitted. The terms as used throughout the disclosure, such as "~ part," "~ module," "~ member," "~ block," etc., may be implemented in software and/or hardware, and a plurality of "~ parts," "~ modules," "~ members," or "~ blocks" may be implemented in a single element, or a single "~ part," "~ module," "~ member," or "~ block" may include a plurality of elements.

It will be understood that when an element is referred to as being "connected" to another element, it can be directly or indirectly connected to the other element, wherein the indirect connection includes "connection" via a wireless communication network.

Also, when a part "includes" or "comprises" an element, unless specifically indicated otherwise, the part may further include other elements, not excluding the other elements.

Further, when it is stated that a layer is "on" another layer or substrate, the layer may be directly on another layer or substrate or a third layer may be disposed therebetween.

As used herein, the singular forms "a," "an" and "the" are intended to include the plural forms as well, unless the context clearly indicates otherwise.

An identification code is used for the convenience of the description but is not intended to illustrate the order of each step. Each of the steps may be implemented in an order different from the illustrated order unless the context clearly indicates otherwise.

Hereinafter, embodiments of a quantum dot complex and a display apparatus including the same will be described in detail with reference to the accompanying drawings.

FIG. 1 is a side cross-sectional view illustrating a structure of a single pixel when a display apparatus is a liquid crystal display (LCD) according to an embodiment.

A display apparatus 1 including a quantum dot complex according to an embodiment may be a liquid crystal display (LCD) apparatus requiring a backlight unit 110.

Referring to FIG. 1, the backlight unit 110 may be installed at the rear of a liquid crystal panel 130, and may supply light necessary for displaying the image by the liquid crystal panel 130. The backlight unit 110 may be classified into an edge-type backlight unit in which the light source is disposed on the side of the liquid crystal panel 130 and a direct-type backlight unit in which the light source is arranged two-dimensionally under the liquid crystal panel 130.

The light emitted from the backlight unit 110 may be incident on the liquid crystal panel 130. For example, the backlight unit 110 may irradiate white light WL.

The white light WL may be incident on a rear polarizing plate 131a of the liquid crystal panel 130, and the rear polarizing plate 131a may polarize the white light WL to transmit only light that vibrates in the same direction as a polarization axis to a rear substrate 132a.

A rear electrode 133a may be installed on the front surface of the rear substrate 132a, and the rear electrode 133a may be a pixel electrode. The rear substrate 132a may be made of a transparent material such as PMMA or glass.

A front electrode 133b may be installed in front of the rear electrode 133a installed on the front surface of the rear substrate 132a. The front electrode 133b may be a common electrode.

A liquid crystal layer 134 may be filled between the rear substrate 132a on which the rear electrode 133a is installed and the front electrode 133b. According to a voltage applied to the rear electrode 133a ((hereinafter referred to as 'pixel electrode') and the front electrode 133b (hereinafter referred to as 'common electrode'), a current flows through the liquid crystal layer 134, and when the current flows through the liquid crystal layer 134, the arrangement of liquid crystal molecules constituting the liquid crystal layer 134 may be arranged.

The light passing through the liquid crystal layer 134 is incident on a color filter layer 135. The color filter layer 135 may include a red light filter 135R that outputs red light RL, a green light filter 135G that outputs green light GL, and a blue light filter 135B that outputs blue light BL. In this case, the color filter layer 135 may use a color filter composed of a dye or pigment that absorbs or transmits a wavelength in a specific region, and may use a quantum dot color filter that converts incident light into a specific color using quantum dots.

One pixel Px may include a red subpixel, a green subpixel, and a blue subpixel, and the pixels may be arranged in two dimensions to form one image. The red subpixel may include the red light filter 135R, the liquid crystal layer 134 that controls the transmittance of light incident on the red light filter 135R, the rear electrode 133a that forms an electric field in the liquid crystal layer 134, and a TFT circuit or the like that applies a voltage to the corresponding rear electrode 133a. The green subpixel may include the green light filter 135G, the liquid crystal layer 134 that controls the transmittance of light incident on the red light filter 135R, the rear electrode 133a that forms an electric field in the liquid crystal layer 134, and the TFT circuit or the like that applies a voltage to the corresponding rear electrode 133a. In addition, the blue subpixel may include the blue light filter 135B, the liquid crystal layer 134 that controls the transmittance of light incident on the red light filter 135R, the rear electrode 133a that forms an electric field in the liquid crystal layer 134, and the TFT circuit or the like that applies a voltage to the corresponding rear electrode 133a.

The light transmitted through the color filter layer 135 or color-converted in the color filter layer 135 may be incident on a front polarizing plate 131b through the front substrate 132b, and the light emitted through the front polarizing plate 131b emitted to the outside may be displayed as an image to a viewer.

As described above, the backlight unit 110 may supply the white light WL to the liquid crystal panel 130. The display apparatus 1 may generate white light by emitting blue light from a light source of the backlight unit 110 and converting a part of blue light emitted from the light source into red light and green light using the quantum dots.

Figure 2:
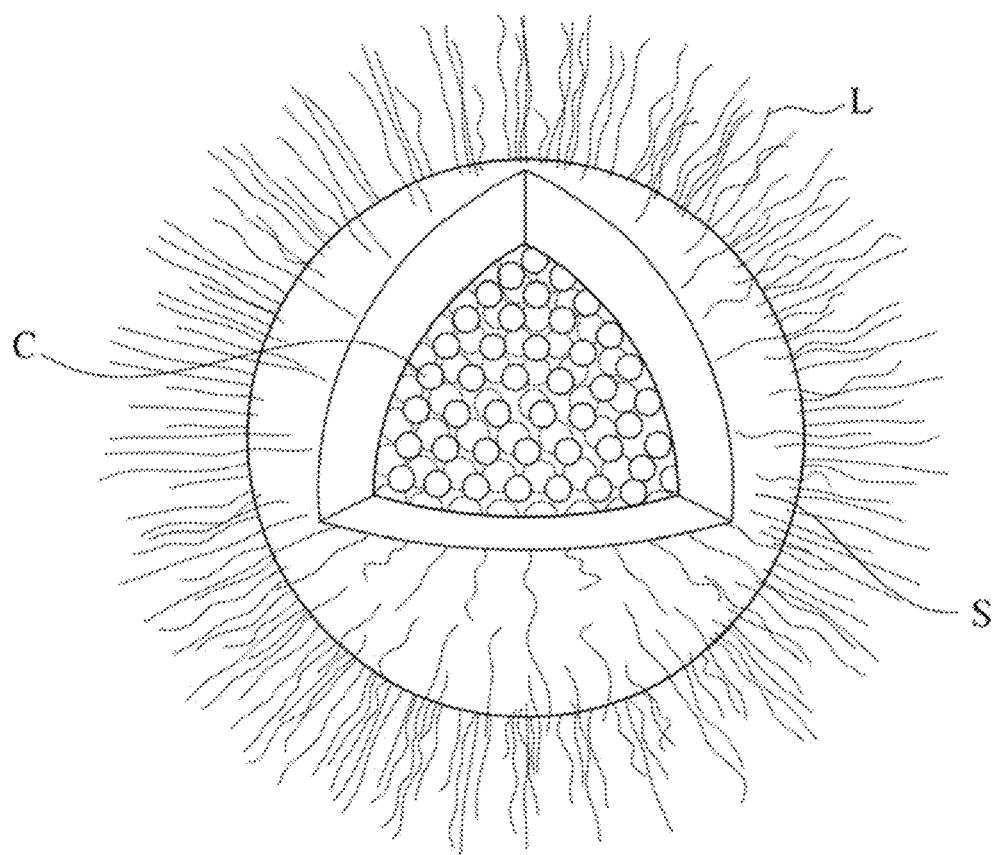
FIG. 2 is a view illustrating a structure of a quantum dot.
Figure 3:
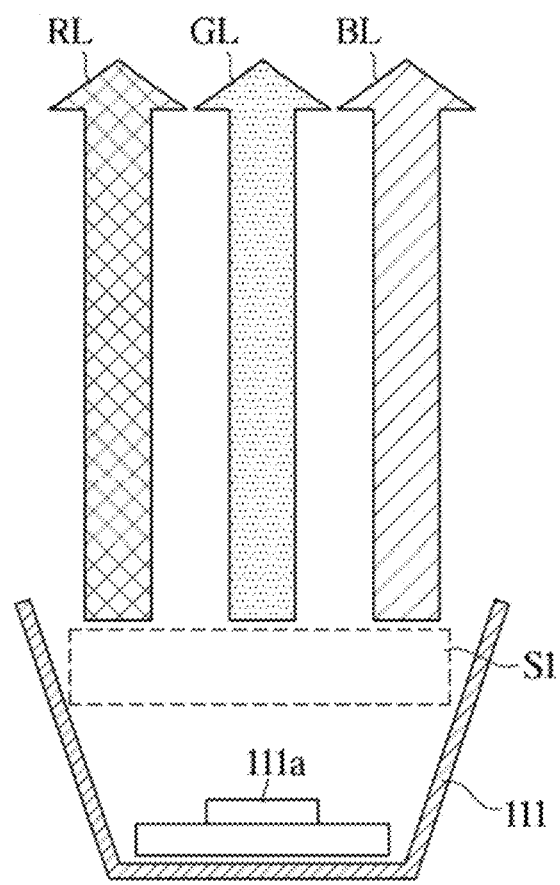
FIGS. 3 and 4 are views illustrating positions where quantum dots are used in a backlight unit according to an embodiment.
Figure 4:
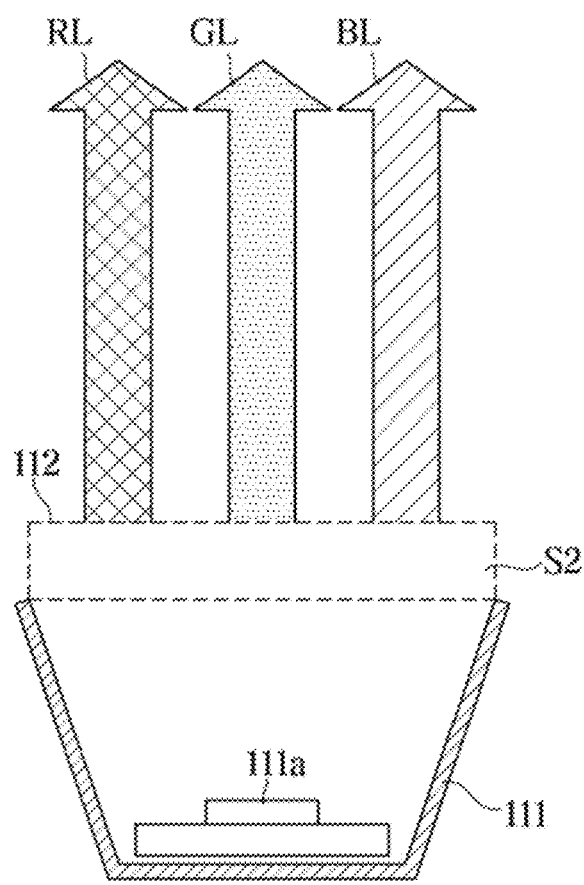
Figure 5:
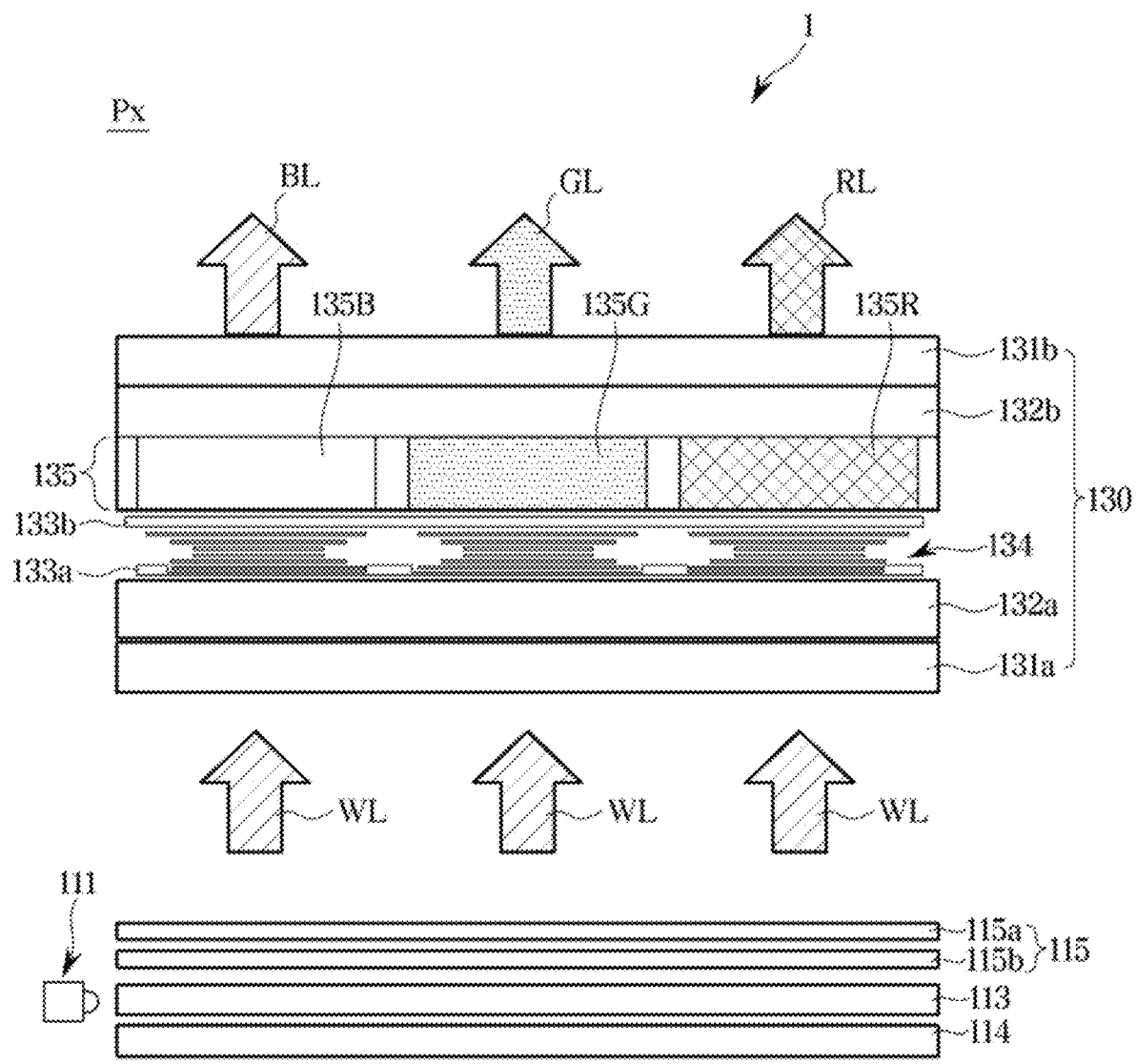
FIG. 5 is a view illustrating a structure when a backlight unit is used in an edge-type in a display apparatus according to an embodiment.

FIG. 2 is a view illustrating a structure of a quantum dot, FIGS. 3 and 4 are views illustrating positions where quantum dots are used in a backlight unit, and FIG. 5 is a view illustrating a structure when a backlight unit is used in an edge-type in a display apparatus.

The quantum dot is a semiconductor crystal formed by gathering hundreds to thousands of atoms. The quantum dots are very small, ranging from several nanometers to tens of nanometers, resulting in a quantum confinement effect.

When the particle is very small, electrons in the particle form a discontinuous energy state by an outer wall of the particle. The quantum confinement effect may refer to an effect of relatively increasing energy state of the electrons and widening an energy band gap as the size of a space within the particle decreases.

The quantum dots may generate light having a wide range of wavelengths when light such as ultraviolet rays or visible rays is incident due to the quantum confinement effect.

When light with a wavelength greater than the energy band gap is incident on the quantum dot, the quantum dot is excited by absorbing the energy of the light, and becomes a ground state by emitting light of a specific wavelength. A length of the wavelength of light generated by the quantum dot may follow the size of the particle. The smaller the size of the quantum dot, light of a relatively short wavelength, for example, blue light or green light may be generated. The larger the size of the quantum dot, light of a relatively long wavelength, for example, red light may be generated. Therefore, it is possible to generate light of various colors by adjusting the size of the quantum dot.

Hereinafter, the quantum dot that can convert incident light into green light is called a green quantum dot, the quantum dot that can convert incident light into red light is called a red quantum dot, and the quantum dot that can convert incident light into blue light is called a blue quantum dot.

Referring to FIG. 2, a quantum dot QD may include a core C, a shell S, and a ligand L. The core C is a part that substantially emits light, and a size of the core C determines an emission wavelength. In order to receive the quantum confinement effect, it must have a size smaller than an exciton bohr radius and have an optical band gap at that size.

The shell S of the quantum dot QD promotes the quantum confinement effect of the core C and determines the stability of the quantum dot QD. In general, the quantum dots are synthesized in the form of core C/shell S, and may use the shell S to prevent oxidation of the core C, reduce a trap energy level on a surface of the core C, and concentrate photons on the core C, thereby increased quantum efficiency.

The ligand L plays a role of preventing the phenomenon that quantum dots QD clump together.

In order to generate white light by applying the quantum dots to the backlight unit 110, a structure such as the example of FIGS. 3 and 4 may be employed. In this example, a blue light emitting diode (LED) is used as a light source 111a of the backlight unit 110 as an example. Therefore, a green quantum dot QD_G and a red quantum dot QD_R are disposed in front of the light source 111a to convert part of the blue light emitted from the light source 111a into the green light and the red light, and to generate the white light by mixing the green light, the red light, and the blue light. Here, the front of the light source 111a may refer to a direction in which the light source 111a emits light.

The display apparatus 1 may be of an in-chip type as in the example of FIG. 3 or an on-chip type as in the example of FIG. 4, and may use the quantum dots for the backlight unit 110. Any type of quantum dot is located in front of the light source 111a.

As illustrated in FIG. 3, in a case of using the quantum dot as the in-chip type, the green quantum dot and the red quantum dot are mounted in a space S1 inside a light source chip 111. As illustrated in FIG. 4, in a case of using the quantum dot as the on-chip type, the green quantum dot and the red quantum dot are put in a space S2 inside a glass tube-shaped rail 112 having a diameter of several mm disposed in front of the light source chip 111 and sealed.

Meanwhile, the backlight unit 110 may be divided into the edge-type in which the light source 111a is disposed on the side of the liquid crystal panel 130 and the direct-type that is arranged in two dimensions at the rear of the liquid crystal panel 130 according to the arrangement thereof.

When using the backlight unit 110 in the edge-type, as illustrated in FIG. 5, the light source chip 111 may be disposed on at least one side of a light guide plate 113, and the green quantum dot and the red quantum dot are sealed in the rail 112 disposed between the light source chip 111 and the light guide plate 113 to use the quantum dot as the on-chip type.

Some of the blue light emitted from the light source 111a may be converted into the green light and the red light by green quantum dots and red quantum dots in the rail 112, and be supplied with the white light to the side of the light guide plate 113 by mixing the green light, the red light, and the blue light.

It goes without saying that the light source chip 111 using the quantum dots in the in-chip type may be disposed on the side of the light guide plate 113.

The light guide plate 113 may change a traveling direction of the light incident from the side and emit light toward the front. The light guide plate 113 may employ transparent, high-intensity PMMA or PC. A plurality of convex stripes may be formed on the front surface of the light guide plate 113 to change the traveling direction of the light, and a plurality of dots may be formed on a rear surface of the light guide plate 113. In addition, the size and spacing of the convex stripes may be adjusted so that uniform light is emitted toward the front surface of the light guide plate 113, and the size and spacing of the dots may be adjusted.

A reflective sheet 114 reflecting light emitted from the rear surface of the light guide plate 113 may be disposed at the rear of the light guide plate 113. An optical sheet 115 for refracting and scattering light emitted from the rear surface of the light guide plate 113 may be disposed in front of the light guide plate 113. For example, the optical sheet 115 may include a diffusion sheet 115b for diffusing light and a prism sheet 115a for refracting light.

Figure 6:
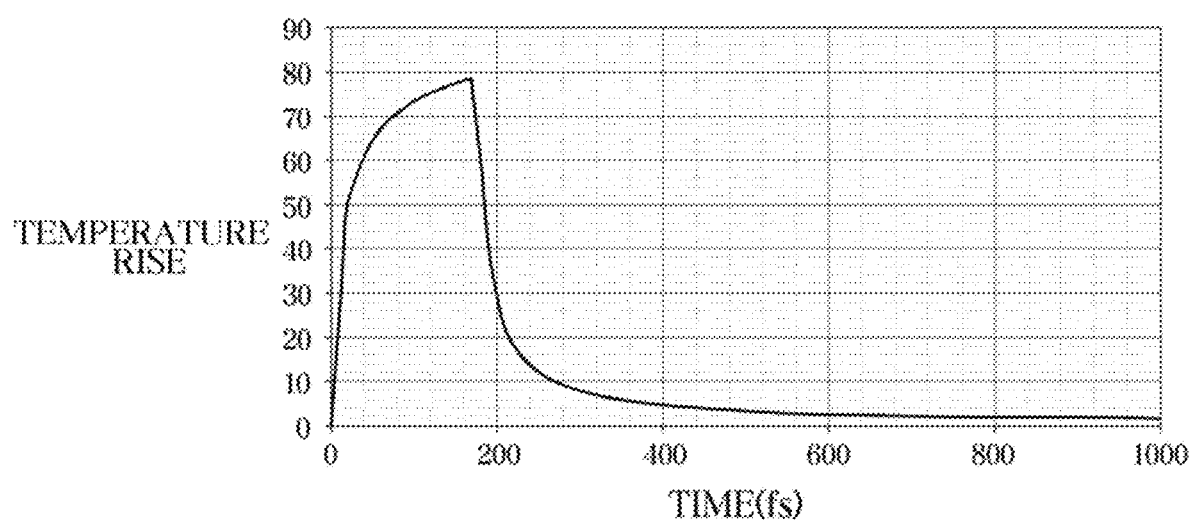
FIG. 6 is a view illustrating a temperature change of a quantum dot that appears when the quantum dot is used in an in-chip type or an on-chip type according to an embodiment.

FIG. 6 is a view illustrating a temperature change of a quantum dot that appears when the quantum dot is used in an in-chip type or an on-chip type.

As described above, when the quantum dot is used as the in-chip type or the on-chip type, it is more advantageous in terms of economy and efficiency compared to a film type or a quantum dot color filter that uses the quantum dot for an entire display area. However, when the quantum dot is used in the in-chip type or the on-chip type, a distance between the light source 111*a* and the quantum dot is close, so that a problem of reducing reliability due to a high density of light incident on the quantum dot and heat generation may occur.

For example, when the quantum dot is used as the in-chip type, reliability may be degraded as the quantum dot is damaged by concentrated heat by the light source within a short time as illustrated in FIG. 6.

When the display apparatus 1 uses the quantum dot in the backlight unit 110, a temperature of the quantum dot may be suppressed by dispersing heat in the oxide by using a combination of the oxide that acts as a heat sink and the quantum dot. Hereinafter, a structure of a quantum dot complex bonded with the oxide and a method of manufacturing the same will be described in detail.

Figure 7:
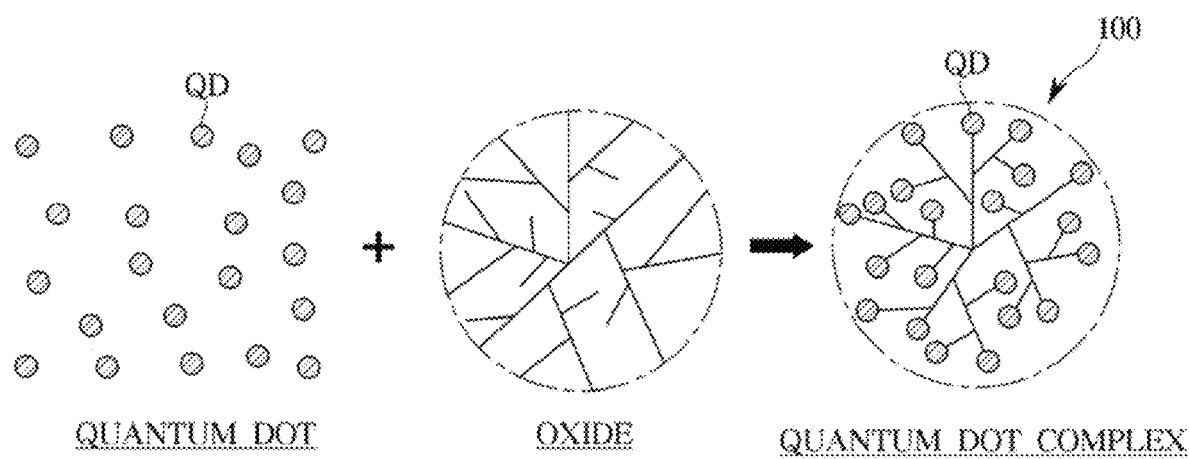
FIG. 7 is a view schematically illustrating a structure of a quantum dot complex according to an embodiment.

FIG. 7 is a view schematically illustrating a structure of a quantum dot complex according to an embodiment, and FIG. 8 is a table illustrating an example of types of oxides bonded with a quantum dot complex.

Referring to FIG. 7, by having a dendritic structure, a quantum dot complex 100 may be formed by combining the quantum dot QD with the oxide having a maximized surface area. The oxide connected to the quantum dot QD transmits light and may be selected from materials with high thermal conductivity.

For example, as illustrated in FIG. 8, a material such as silica (silicon dioxide: $SiO_2$), $Al_2O_3$, and $TiO_2$ may be selected as the material that forms the quantum dot complex 100 by being connected to the quantum dot QD. However, since the embodiment of the display apparatus 1 is not limited thereto, it goes without saying that other materials other than the materials illustrated in a table of FIG. 8 may be used as oxides that are connected to the quantum dot QD as long as the other materials transmit light and have a high thermal conductivity.

Referring back to FIG. 7, when the oxide having the high thermal conductivity is made into the dendritic structure and connected to the quantum dot QD, heat generated from the light source 111*a* or the quantum dot QD is dispersed into the oxide, so that rapid temperature rise of the quantum dot can be suppressed. That is, the dendritic oxide may discharge heat generated from the light source 111*a* or the quantum dot QD to perform a function of the heat sink.

Hereinafter, for a more specific description, a case of using silica as the oxide will be described as an example.

Figure 9:
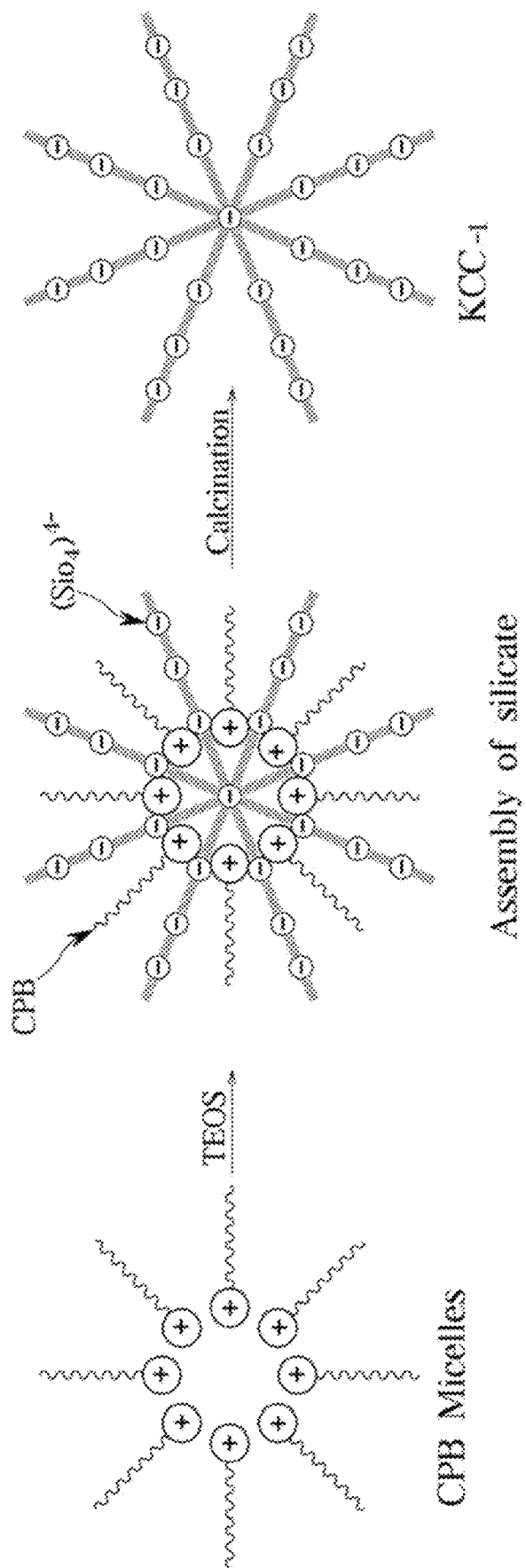
FIG. 9 is a view schematically illustrating a process of manufacturing silica of a dendritic structure according to an embodiment.
Figure 10:
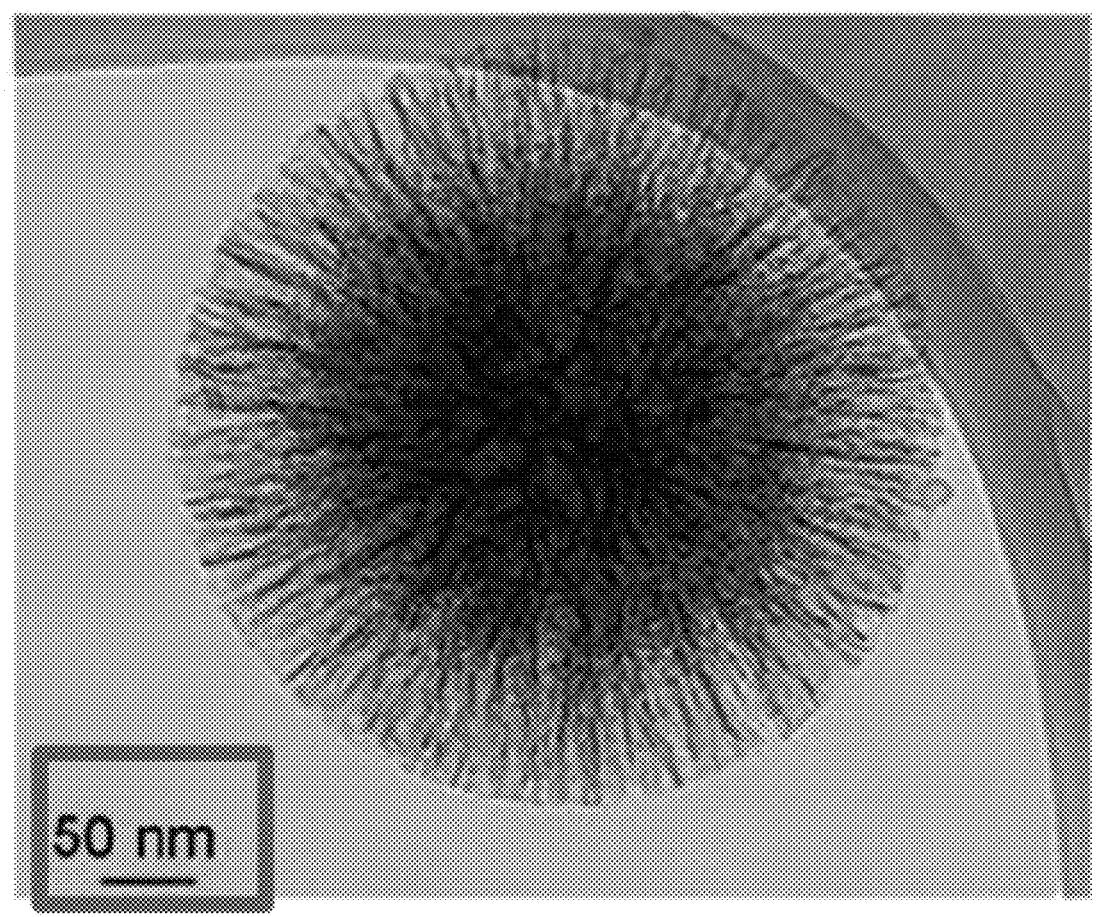
FIG. 10 is a photomicrograph of silica manufactured according to a process of FIG. 9.

FIG. 9 is a view schematically illustrating a process of manufacturing silica having a dendritic structure, and FIG. 10 is a photomicrograph of silica manufactured according to a process of FIG. 9.

As an example of silica, fibrous nano-silica (KCC-1) may be used. Referring to FIG. 9, CetylPyridinium Bromide (CPB) mixed with urea and TetraEthyl OrthoSilicate (TEOS) dissolved in a solution of cyclohexane and pentanol were mixed, stirred at room temperature for about 30 minutes, and then placed in a Teflon-sealed microwave reactor.

A reaction mixture is exposed to microwave radiation with a power of up to 400 W, and after the reaction is complete the mixture may be cooled to room temperature. The silica produced here is separated by centrifugation, washed with distilled water and acetone, and then dried in air for about 24 hours.

The synthesized material may be calcined at 550° C. for about 6 hours to become the oxide (KCC-1) having a dendritic nanosphere structure as illustrated in a photomicrograph of FIG. 10.

Figure 11:
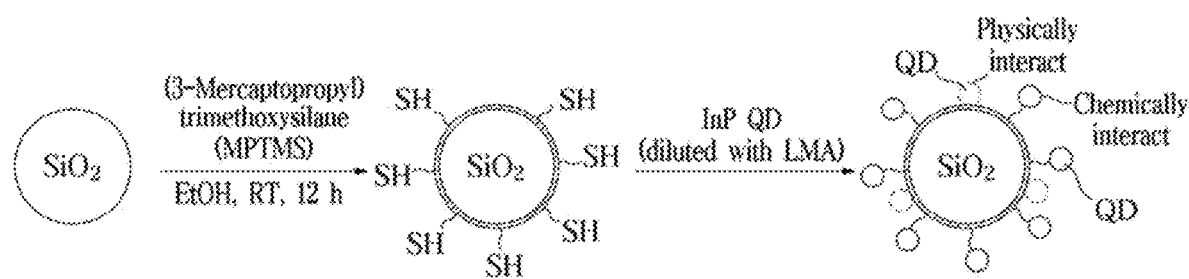
FIG. 11 is a view schematically illustrating a process of doping a quantum dot on silica having dendritic according to an embodiment.
Figure 12:
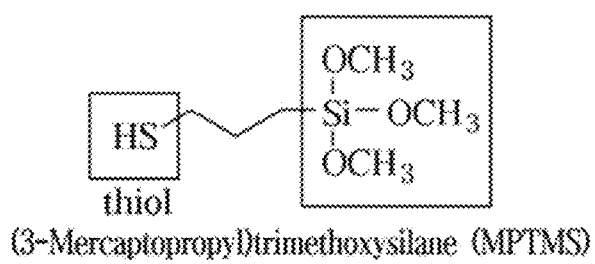
FIG. 12 is a view illustrating a chemical structure of a silane coupling agent used for surface treatment of silica according to an embodiment.

FIG. 11 is a view schematically illustrating a process of doping a quantum dot on silica having dendritic, and FIG. 12 is a view illustrating a chemical structure of a silane coupling agent used for surface treatment of silica.

Referring to FIG. 11, in order to introduce a functional group capable of chemical bonding between silica and the quantum dots QD, a silica surface treatment may be performed using a silane coupling agent.

As an example, (3-Mercaptopropyl) Trimethoxysilane (MPTMS) having a chemical structure illustrated in FIG. 12 may be used as a silane coupling agent.

When a surface modification treatment is performed by stirring silica and MPTMS at room temperature using an ethanol (EtOH) solvent, as illustrated in FIG. 11, Trimethoxysilane may coat the surface of silica nanoparticles, and the silica nanoparticles have a thiol (—SH) group, which is an edge functional group.

When the surface-treated silica nanoparticles and the quantum dots are mixed, the quantum dots QD physically adsorb onto the coated surface of the silica nanoparticles and chemically bond with the thiol groups, as illustrated in FIG. 11. In this way, the quantum dot bonded with the oxide, for example, silica nanoparticles, will be referred to as the quantum dot complex 100.

Figure 13:
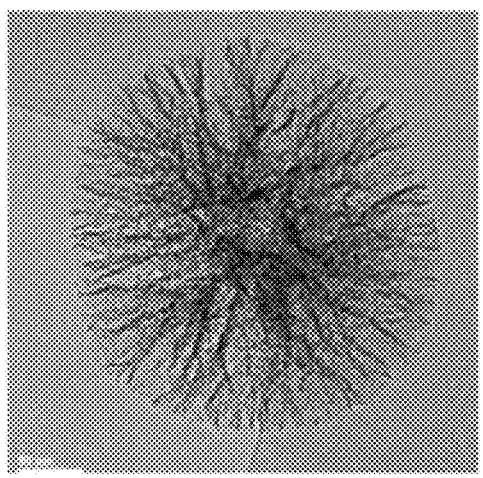
FIG. 13 is a view comparing photomicrographs of silica not doped with quantum dots and silica doped with quantum dots according to an embodiment.
Figure 13:
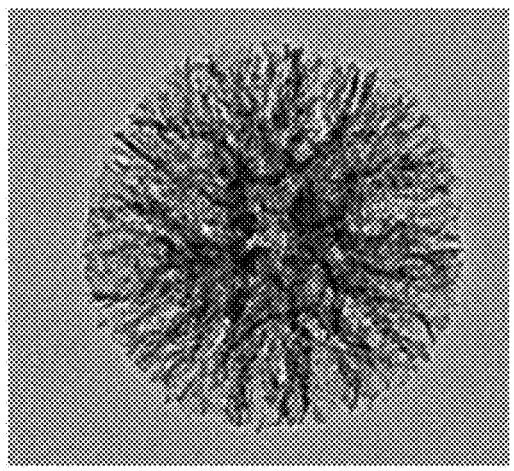
Figure 14:
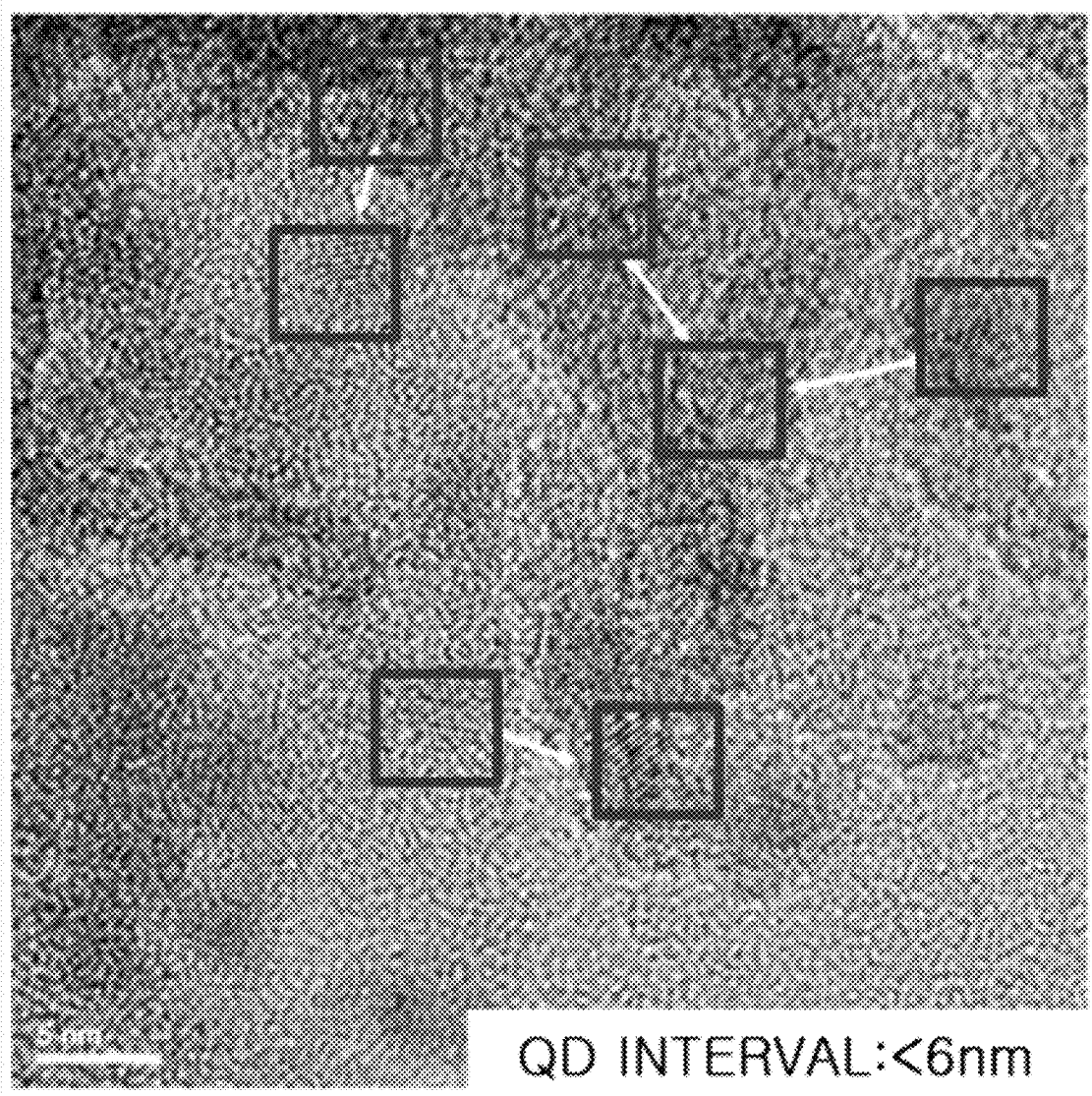
FIG. 14 is a photomicrograph of an enlarged quantum dot in a quantum dot doped silica according to an embodiment.

FIG. 13 is a view comparing photomicrographs of silica not doped with quantum dots and silica doped with quantum dots, and FIG. 14 is a photomicrograph of an enlarged quantum dot in a quantum dot doped silica.

Referring to FIG. 13, when the quantum dot is doped on the silica performed to the surface treatment using the silane coupling agent according to the process described in FIG. 11, the quantum dot may physically and chemically bond to the surface of the silica. When comparing the silica not doped with the quantum dot on a left side of FIG. 13 and the silica doped with the quantum dot on a right side of FIG. 13, it can be seen that the quantum dots are coupled to the silica on the right side.

In addition, as illustrated in FIG. 14, it can be seen that the quantum dots bonded to the surface of the silica are spaced apart at intervals less than 6 nm, for example, of about 2 to 6 nm. The quantum dots bonded to the silica may include the green quantum dots and the red quantum dots. In addition, it is possible to include the blue quantum dots according to the color of the light source 111*a* or the color of light to be supplied to the liquid crystal panel 130.

When different types of quantum dots are very closely aggregated, the energy required to emit light by absorbing short wavelength light is transmitted to the adjacent quantum dot with a low energy level, resulting in decreased luminous efficiency. For example, if the green quantum dots cannot use all the energy received from the blue light to emit green light and the energy is transmitted to the adjacent red quantum dots, the energy is dispersed and the luminous efficiency decreases.

As illustrated in FIG. 14, in the quantum dot complex according to the embodiment, as the quantum dots are physically or chemically bonded to the surface of silica, the intervals between the quantum dots are separated by nanometer intervals, so it is possible to prevent the decrease in the luminous efficiency caused by the aggregation of different types of quantum dots.

Figure 15:
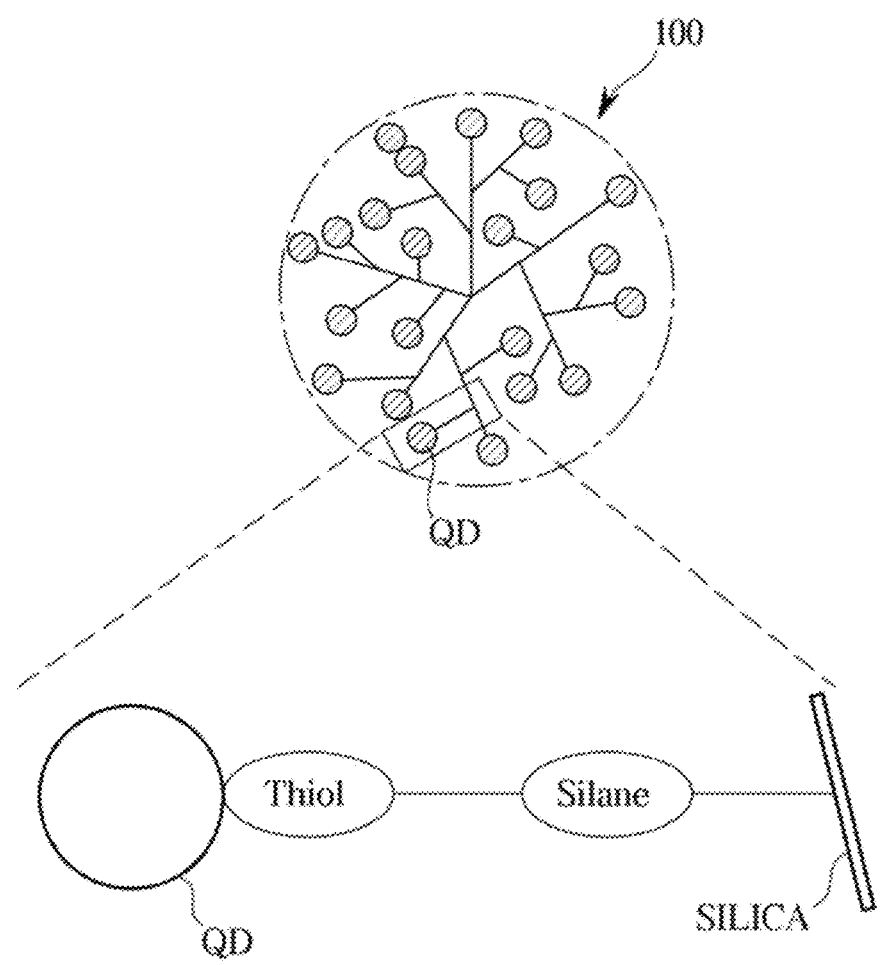
FIG. 15 is a view schematically illustrating a chemical bond between silica and quantum dots according to an embodiment.
Figure 16:
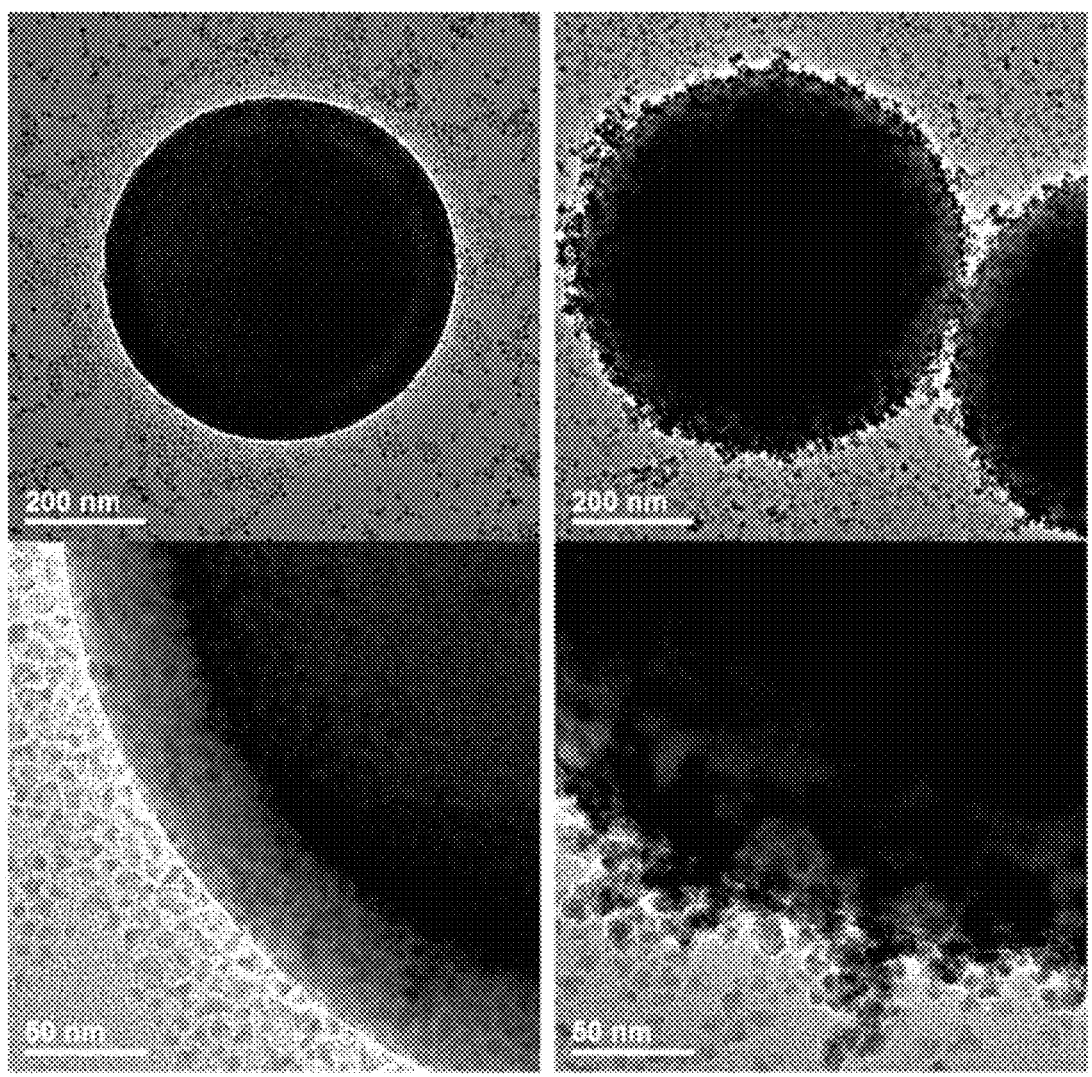
FIG. 16 is a photomicrograph photographing a quantum dot bonded with a thiol group-free silica nanoparticle and a quantum dot bonded with a thiol functional group silica nanoparticle according to an embodiment.
Figure 17A:
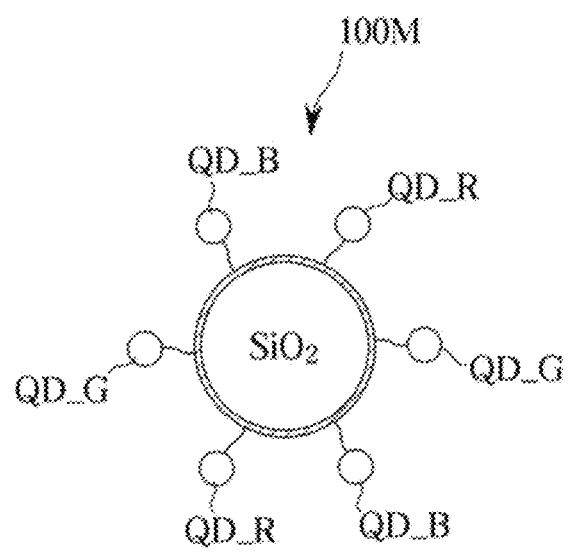
FIGS. 17A, 17B, 17C, and 17D are views illustrating a quantum dot complex classified according to types of bonded quantum dots, according to an embodiment.
Figure 17B:
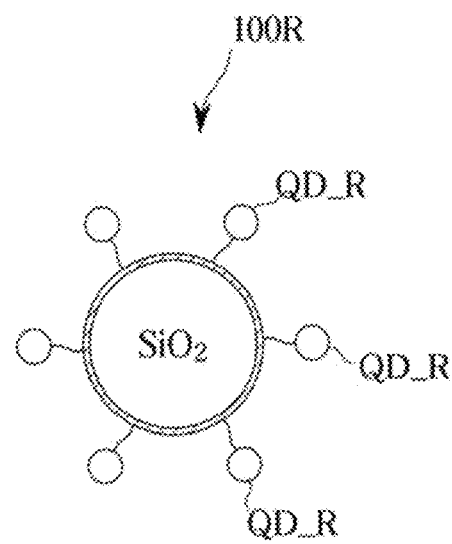
Figure 17C:
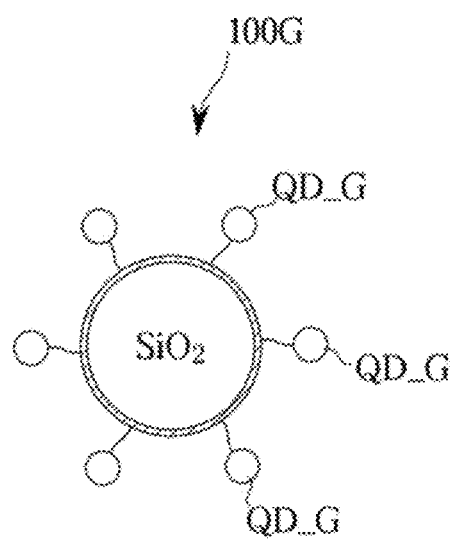
Figure 17D:
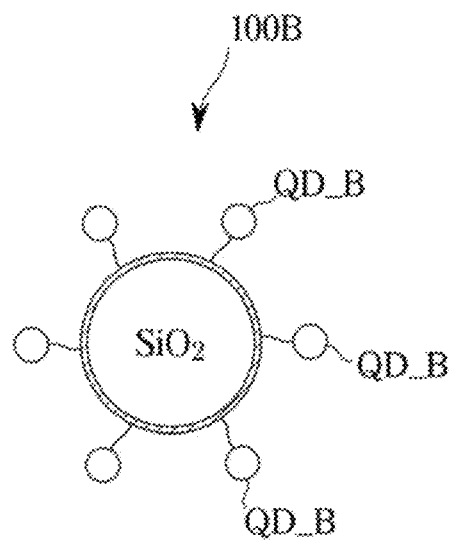

FIG. 15 is a view schematically illustrating a chemical bond between silica and quantum dots, and FIG. 16 is a photomicrograph photographing a quantum dot bonded with a thiol group-free silica nanoparticle and a quantum dot bonded with a thiol functional group silica nanoparticle.

Referring to FIG. 15, in the quantum dot complex 100 according to the embodiment, the quantum dots QD not only physically adsorb to the surface of silica nanoparticles, but also chemically bond with the thiol (—SH) groups. The distance between the bonded silica nanoparticles and the quantum dot QD is less than 1 nm, which is sufficient to dissipate the heat generated by the quantum dot QD.

Referring to FIG. 16, it can be seen that more quantum dots QD are bound when there is the edge functional group (thiol) on the surface of the silica nanoparticles (right) than when there is no edge functional group (thiol) on the surface of the silica nanoparticles (left).

In the quantum dot complex 100 according to the embodiment, since the quantum dot is bonded with the oxide having the high thermal conductivity, the oxide acts as the heat sink, so that the heat emitted from the light source 111a or the quantum dot QD is dispersed into the oxide, and reliability degradation due to heat generation of the quantum dots QD can be prevented.

FIGS. 17A, 17B, 17C, and 17D are views illustrating a quantum dot complex classified according to types of bonded quantum dots, according to an embodiment.

Depending on the use of the quantum dot complex 100, the type of quantum dot bonded to the oxide may be different. Referring to FIGS. 17A to 17D, the types of quantum dot complex 100 may include a mixed quantum dot complex 100M in which two or more types of quantum dots are bonded to the oxide, a red quantum dot complex 100R in which the red quantum dots are bonded to the oxide, and a green quantum dot complex 100G in which the green quantum dots are bonded to the oxide. In addition, if necessary, it is possible to further include a blue quantum dot complex 100B in which the blue quantum dots are bonded to oxide.

In a case of generating the white light by using an in-chip method or an on-chip method for the backlight unit 110, the mixed quantum dot complex 100M generated by combining the red quantum dot QD_R and the green quantum dot QD_G on the oxide may be used.

In addition, since it is possible to use an on-surface method in which the quantum dot complex is disposed on the backlight unit 110 in the film type, the mixed quantum dot complex 100M may also be used in this case.

When the quantum dot complex 100 is used for a color filter, the red quantum dot complex 100R may be used to implement the red subpixel and the green quantum dot complex 100G may be used to implement the green subpixel. When the light supplied from the backlight unit 110 is the white light, the blue quantum dot complex 100B may be used to implement the blue subpixel.

In the above-described example, the quantum dot complex 100 is applied to the display apparatus 1 including the backlight unit 110 as the example, but embodiments of the disclosure are not limited thereto.

As another example, when the display apparatus 1 is implemented as a self-luminous display apparatus that does not require the backlight unit 110, the quantum dot complex 100 may be used for the display panel itself.

Figure 18:
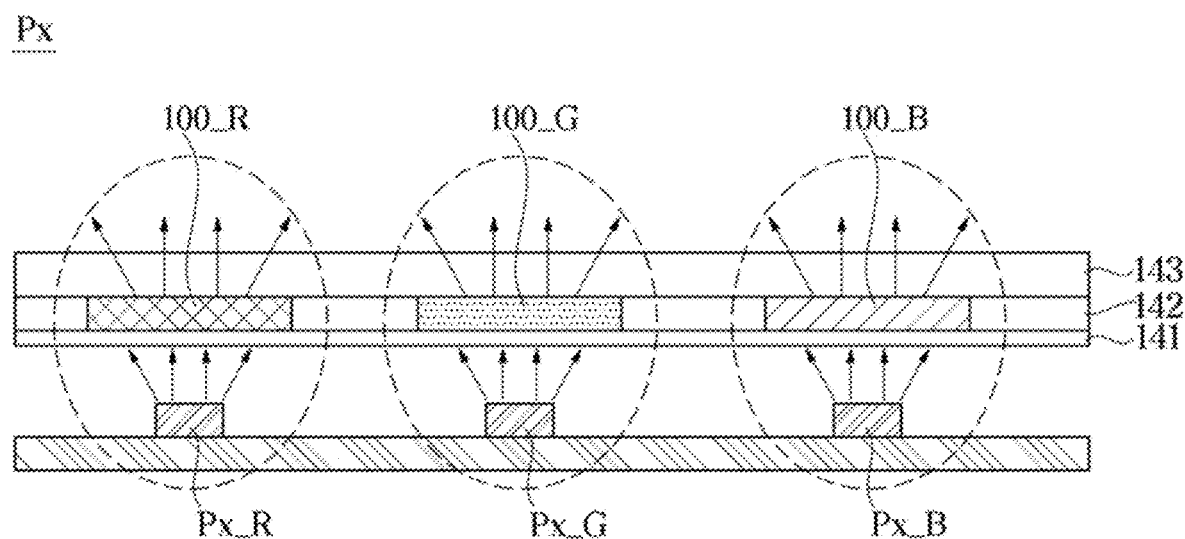
FIG. 18 is a side cross-sectional view illustrating a single pixel when a display apparatus is a micro light emitting diode (LED) display apparatus, according to an embodiment.

FIG. 18 is a side cross-sectional view illustrating a single pixel when a display apparatus is a micro light emitting diode (LED) display apparatus, according to an embodiment, and FIG. 19 is a table illustrating efficiency of color conversion of blue light using quantum dots in a micro LED display apparatus.

The display apparatus 1 may be implemented as a micro LED display apparatus. The micro LED display apparatus is the self-luminous display apparatus in which light emitting elements are arranged for each pixel so that each pixel can emit light by itself. Therefore, unlike a liquid crystal display apparatus, since the display apparatus 1 does not require components such as a backlight unit, a liquid crystal layer, and a polarizing plate, it can implement a thin thickness, and its structure is simple and various design changes are possible.

Referring to FIG. 18, the light source 111a is mounted on a backplane 120, where the light source 111a employs a micro-unit LED, thereby reducing a pixel size and implementing a high resolution.

For example, when the blue LED is employed as the light source 111a, the quantum dot complex 100 may be disposed in front of the light source 111a to convert the blue light emitted from the light source 111a into light having a different wavelength.

In a related art micro LED display apparatus, subpixels constituting a single pixel Px may include the blue LED, the red LED, and the green LED. However, in the display apparatus 1 according to the embodiment, a red subpixel Px_R, a green subpixel Px_G, and a blue subpixel Px_B all include blue LEDs as the light source 111a. The red quantum dot complex 100R may be disposed in front of the blue LED of the red subpixel Px_R, and the green quantum dot complex 100G may be disposed in front of the blue LED of the green subpixel Px_G. In front of the blue LED of the blue subpixel Px_B, a transmitting part that transmits the blue light may be disposed.

The red and green quantum dot complexes 100R and 100G of each subpixel may be surrounded and supported by a metal 142 and a cover glass 143 and sealed by an encapsulation layer 141.

The blue light emitted from the blue LED of the red subpixel Px_R may be converted to red while passing through the red quantum dot complex 100R and, the blue light emitted from the blue LED of the green subpixel Px_G may be converted to green while passing through the green quantum dot complex 100G.

In such a structure, a light emitting surface moves to the red and green quantum dot complexes 100R and 100G and the transmitting part, so that a distribution of LEDs and non-uniformity of transfer can be improved.

On the other hand, as illustrated in the structure of FIG. 18, when the red and green quantum dot complexes 100R and 100G are disposed in front of the light source 111a in each subpixel, the distance between the light source 111a and the red and green quantum dot complexes 100R and 100G becomes very close. If a related art quantum dot is used in such the structure, the reliability of the quantum dot may be deteriorated due to high density light and heat emitted from the light source 111a. However, in the red and green quantum dot complexes 100R and 100G according to the embodiment, since the oxide bonded to the quantum dot acts as the heat sink, it is possible to prevent the decrease in reliability due to the temperature increase of the quantum dot.

Referring to a table of FIG. 19, the luminous efficiency of the red LED is about 5%, the luminous efficiency of the green LED is about 20%, and the luminous efficiency of the blue LED is about 40%. Therefore, when each subpixel is implemented with the red LED, the green LED, and the blue LED, the luminous efficiency of the red subpixel and the green subpixel decreases.

When the red quantum dot converts the blue light into the red light, the conversion efficiency is about 69%. When THE green quantum dot converts THE blue light into THE green light, the conversion efficiency is about 85%. Accordingly, as in the example of FIG. 18 described above, the red subpixel Px_R, the green subpixel PX_G, and the blue subpixel (PX_B) all include the blue LED as the light source 111a. When the red quantum dot complex 100R is placed in front of the blue LED of the red subpixel Px_R and the green quantum dot complex 100G is placed in front of the blue LED of the green subpixel Px_G, the luminous efficiency at the red subpixel is about 27%, which can be expected to increase efficiency by 5 times compared to the case of using the red LED, and the luminous efficiency at the green subpixel is about 34%, which can be expected to increase efficiency by 1.7 times compared to the case of using the green LED.

According to the quantum dot complex and the display apparatus including the same according to the above-described embodiment, by combining the oxide acting as the heat sink to the quantum dot, it is possible to prevent a decrease in reliability due to concentrated heat generation of the quantum dot by the light emitted from the light source.

While certain embodiments have been particularly shown and described with reference to the drawings, embodiments are provided for the purposes of illustration and it will be understood by one of ordinary skill in the art that various modifications and equivalent other embodiments may be made from the disclosure. Accordingly, the true technical scope of the disclosure is defined by the technical spirit of the appended claims.

What is claimed is:

1. A display apparatus comprising:
   a light source; and
   a quantum dot complex disposed in front of the light source, and configured to convert a wavelength of light emitted from the light source,
   wherein the quantum dot complex comprises:
      an oxide having dendritic structure; and
      a quantum dot bonded to the oxide.

2. The display apparatus according to claim 1, wherein the oxide comprises at least one from among silicon dioxide ($SiO_2$), aluminum oxide ($Al_2O_3$), and titanium dioxide ($TiO_2$).

3. The display apparatus according to claim 1, wherein the oxide is configured to have a functional group, on a surface of the oxide, chemically bonded to a surface of the quantum dot.

4. The display apparatus according to claim 1, wherein the oxide comprises silicon dioxide ($SiO_2$), and is surface-treated by a silane coupling agent to have a thiol functional group.

5. The display apparatus according to claim 4, wherein the quantum dot is further configured to physically adsorb to a surface of the surface-treated $SiO_2$ and chemically bond with the thiol functional group.

6. The display apparatus according to claim 1, wherein the quantum dot complex is disposed in front of the light source by an in-chip method or an on-chip method.

7. The display apparatus according to claim 1, further comprising:
   a liquid crystal panel; and
   a backlight unit configured to supply light to the liquid crystal panel, and comprising the light source and the quantum dot complex.

8. The display apparatus according to claim 1, wherein the light source comprises a blue light emitting diode (LED) configured to emit a blue light; and
   wherein the quantum dot complex further comprises:
      a red quantum dot configured to convert the blue light into a red light; and
      a green quantum dot configured to convert the blue light into a green light.

9. The display apparatus according to claim 1, wherein the light source comprises a blue light emitting diode (LED) included in a red subpixel, a blue LED included in a green subpixel, and a blue LED included in a blue subpixel; and
   wherein the quantum dot complex further comprises:
      a red quantum dot complex included in the red subpixel, and configured to convert a blue light to a red light; and
      a green quantum dot complex included in the green subpixel, and configured to convert the blue light to a green light.

10. The display apparatus according to claim 1, wherein the oxide is configured to emit heat generated by the light source or the quantum dot.

11. A quantum dot complex comprising:
    an oxide having dendritic structure; and
    a quantum dot bonded to the oxide.

12. The quantum dot complex according to claim 11, wherein the oxide comprises at least one from among silicon dioxide ($SiO_2$), aluminum oxide ($Al_2O_3$), and titanium dioxide ($TiO_2$).

13. The quantum dot complex according to claim 11, wherein the oxide is configured to have a functional group, on a surface of the oxide, chemically bonded to a surface of the quantum dot.

14. The quantum dot complex according to claim 11, wherein the oxide comprises silicon dioxide ($SiO_2$), and is surface-treated by a silane coupling agent to have a thiol functional group.

15. The quantum dot complex according to claim 14, wherein the quantum dot is configured to physically adsorb to a surface of the surface-treated $SiO_2$ and chemically bond with the thiol functional group.

* * * * *